US012660677B2

(12) United States Patent
Ko et al.

(10) Patent No.: US 12,660,677 B2
(45) Date of Patent: Jun. 16, 2026

(54) SEMICONDUCTOR PACKAGE WITH SEMICONDUCTOR DEVICES

(71) Applicant: SAMSUNG ELECTRONICS CO., LTD., Suwon-si (KR)

(72) Inventors: Yeongkwon Ko, Suwon-si (KR);
Unbyoung Kang, Suwon-si (KR);
Soyeon Kwon, Suwon-si (KR);
Chungsun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 459 days.

(21) Appl. No.: 18/371,714

(22) Filed: Sep. 22, 2023

(65) Prior Publication Data

US 2024/0213109 A1     Jun. 27, 2024

(30) Foreign Application Priority Data

Dec. 26, 2022     (KR) ........................ 10-2022-0185018

(51) Int. Cl.
| | |
|---|---|
| *H01L 23/31* | (2006.01) |
| *H01L 23/00* | (2006.01) |
| *H01L 23/29* | (2006.01) |
| *H01L 25/065* | (2023.01) |
| *H10B 80/00* | (2023.01) |

(52) U.S. Cl.
CPC ........ *H01L 23/3178* (2013.01); *H01L 23/291* (2013.01); *H01L 24/08* (2013.01); *H01L 24/16* (2013.01); *H01L 24/94* (2013.01); *H01L 24/96* (2013.01); *H01L 25/0652* (2013.01); *H01L 25/0657* (2013.01); *H01L 24/32* (2013.01); *H01L 24/73* (2013.01); *H01L 2224/08145*

(2013.01); *H01L 2224/16227* (2013.01); *H01L 2224/32225* (2013.01); *H01L 2224/73204* (2013.01); *H01L 2224/94* (2013.01); *H01L 2224/96* (2013.01); *H01L 2225/06524* (2013.01); *H01L 2225/06568* (2013.01);

(Continued)

(58) Field of Classification Search
CPC . H01L 25/0652; H01L 25/0657; H01L 24/08; H01L 24/16; H01L 24/94; H01L 24/96; H01L 23/291; H01L 23/3178
See application file for complete search history.

(56) References Cited

U.S. PATENT DOCUMENTS

| | | | |
|---|---|---|---|
| 6,261,883 B1 | 7/2001 | Koubuchi et al. | |
| 6,433,438 B2 | 8/2002 | Koubuchi et al. | |

(Continued)

FOREIGN PATENT DOCUMENTS

| | | |
|---|---|---|
| JP | 5453123 B2 | 3/2014 |
| JP | 6564670 B2 | 8/2019 |

*Primary Examiner* — Steven M Page
(74) *Attorney, Agent, or Firm* — Sughrue Mion, PLLC

(57) ABSTRACT

Provided is a semiconductor package including a first semiconductor device including a first semiconductor substrate, a first interconnect structure on the first semiconductor substrate, and a trench extending into the first interconnect structure and a portion of the first semiconductor substrate, a second semiconductor device on the first semiconductor device, and a cover insulating layer on the first semiconductor device and a side surface of the second semiconductor device, the cover insulating layer including a first portion filling the trench included in the first semiconductor device and contacting the first semiconductor substrate.

20 Claims, 18 Drawing Sheets

(52) U.S. Cl.
CPC ................. *H01L 2924/1431* (2013.01); *H01L 2924/1435* (2013.01); *H10B 80/00* (2023.02)

(56) References Cited

U.S. PATENT DOCUMENTS

| | | | |
|---|---|---|---|
| 8,053,337 B2 | 11/2011 | Noda | |
| 8,580,657 B2 | 11/2013 | Kuo et al. | |
| 8,871,614 B2 | 10/2014 | Kim et al. | |
| 9,589,903 B2 | 3/2017 | Chen et al. | |
| 10,910,270 B2 | 2/2021 | Choi et al. | |
| 11,018,091 B2 | 5/2021 | Chen et al. | |
| 2021/0098421 A1* | 4/2021 | Wu | H01L 23/295 |
| 2021/0193581 A1* | 6/2021 | Seo | H01L 23/5384 |
| 2021/0391265 A1* | 12/2021 | Jung | H01L 23/5383 |
| 2022/0262743 A1 | 8/2022 | Chang et al. | |
| 2022/0293563 A1* | 9/2022 | Ko | H01L 25/0657 |

\* cited by examiner 100
511
200

SEMICONDUCTOR PACKAGE WITH SEMICONDUCTOR DEVICES

CROSS-REFERENCE TO RELATED APPLICATION

This application is based on and claims priority to Korean Patent Application No. 10-2022-0185018, filed on Dec. 26, 2022, in the Korean Intellectual Property Office, the disclosure of which is incorporated by reference herein in its entirety.

BACKGROUND

Embodiments of the present disclosure relate to a semiconductor package, and more particularly, to a semiconductor package including a plurality of semiconductor devices.

As miniaturization, multifunctionalization, and high performance of electronic products are required, high integration and high speed of semiconductor packages are also required. To this end, a semiconductor package has been developed to include a plurality of mutually stacked semiconductor devices.

SUMMARY

One or more embodiments provide a semiconductor package including a plurality of semiconductor devices.

According to an aspect of an embodiment, there is provided a semiconductor package including a first semiconductor device including a first semiconductor substrate, a first interconnect structure on the first semiconductor substrate, and a trench extending into the first interconnect structure and a portion of the first semiconductor substrate, a second semiconductor device on the first semiconductor device, and a cover insulating layer on the first semiconductor device and a side surface of the second semiconductor device, the cover insulating layer including a first portion filling the trench included in the first semiconductor device and contacting the first semiconductor substrate.

According to another aspect of an embodiment, there is provided a semiconductor package including a first semiconductor device including a first semiconductor substrate, a second semiconductor device including a second semiconductor substrate, a plurality of through electrodes penetrating the second semiconductor substrate, and a plurality of conductive pads on an upper surface of the second semiconductor substrate and connected to the plurality of through electrodes, respectively, and a cover insulating layer including a side cover on the first semiconductor device and extending along a side surface of the second semiconductor device and a passivation layer on the upper surface of the second semiconductor substrate and side surfaces of the plurality of conductive pads, wherein the cover insulating layer including a groove, extending along an edge of an upper surface of the cover insulating layer, in an edge portion of the upper surface of the cover insulating layer.

According to another aspect of an embodiment, there is provided a semiconductor package including a connecting board, a first semiconductor device on the connecting board, the first semiconductor device including a first semiconductor substrate, a first interconnect structure, and a trench extending into the first interconnect structure and a portion of the first semiconductor substrate, a second semiconductor device between the connecting board and the first semiconductor device, the second semiconductor device including a second semiconductor substrate, a plurality of through electrodes penetrating through the second semiconductor substrate, and a plurality of conductive pads on a surface of the second semiconductor substrate and connected to the plurality of through electrodes, respectively, a cover insulating layer between the connecting board and the first semiconductor device and on side surfaces of the second semiconductor device, and a plurality of connection bumps between the plurality of conductive pads and the connecting board, wherein the cover insulating layer includes a gap-fill portion in the trench included in the first semiconductor device and contacting the first semiconductor substrate.

BRIEF DESCRIPTION OF DRAWINGS

Embodiments will be more clearly understood from the following detailed description taken in conjunction with the accompanying drawings in which:

FIG. 6 is a cross-sectional view illustrating a semiconductor package, according to another embodiment;

FIG. 8 is a cross-sectional view illustrating a semiconductor package, according to another embodiment.

DETAILED DESCRIPTION

Figure 1:
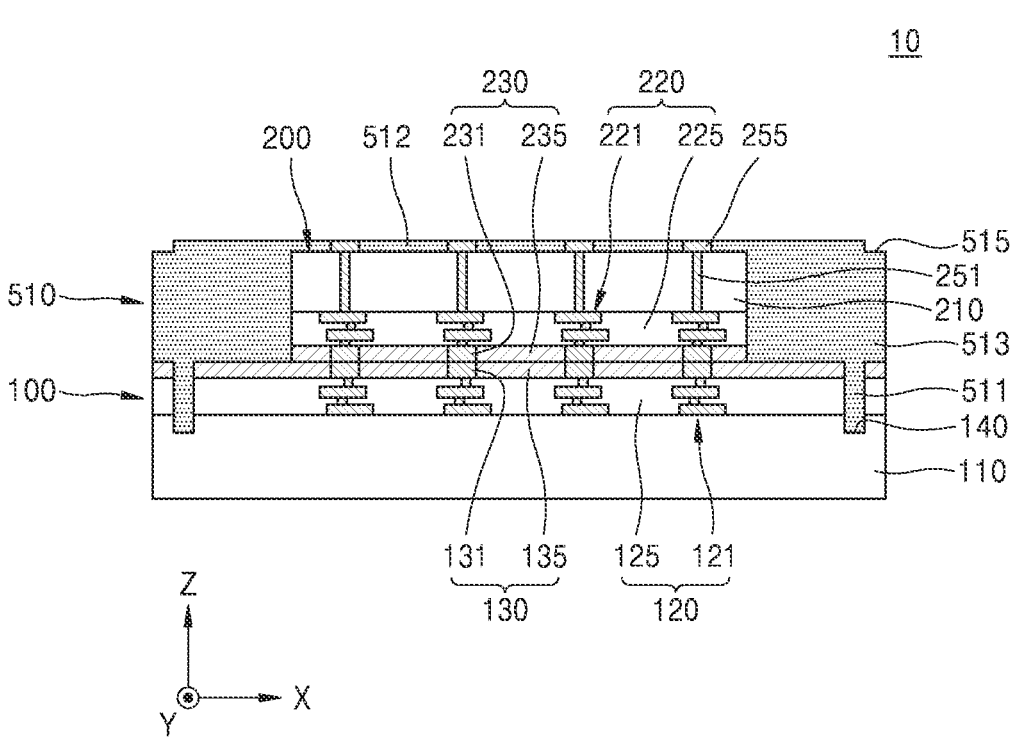
FIG. 1 is a cross-sectional view illustrating a semiconductor package, according to an embodiment.

Hereinafter, embodiments of the technical idea will be described in detail with reference to the accompanying drawings. The same reference numerals denote the same elements in the drawings, and redundant descriptions thereof are omitted.

Embodiments described herein are example embodiments, and thus, the disclosure is not limited thereto.

In this specification, a vertical direction may be defined as a Z direction, and a horizontal direction may be defined as a direction perpendicular to the Z direction. A first horizontal direction and a second horizontal direction may be defined as directions crossing each other. The first horizontal direction may be referred to as an X direction, and the second horizontal direction (Y direction) may be referred to as a Y direction. A vertical level may refer to a height level according to the vertical direction. A horizontal width of the element refers to a length of the element in the horizontal direction, a thickness or a vertical length of the element refers to a length in the vertical direction, and a planar area of the element refers to an area occupied by the element on an XY plane.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to"

or "directly coupled to" another element or layer, there are no intervening elements or layers present.

FIG. 1 is a cross-sectional view illustrating a semiconductor package, according to an embodiment.

Referring to FIG. 1, a semiconductor package 10 may include a first semiconductor device 100, a second semiconductor device 200 stacked on the first semiconductor device 100, and a cover insulating layer 510 covering at least a portion of the first semiconductor device 100 and at least a portion of the second semiconductor device 200.

The first semiconductor device 100 and the second semiconductor device 200 may be bonded to each other. The first semiconductor device 100 and the second semiconductor device 200 may be bonded by, for example, metal-to-metal bonding or hybrid bonding. In embodiments, the first semiconductor device 100 and the second semiconductor device 200 may be bonded by face-to-face bonding. A planar area of the first semiconductor device 100 may be larger than a planar area of the second semiconductor device 200. In embodiments, the second semiconductor device 200 may be arranged on the central portion of the first semiconductor device 100.

In embodiments, the first semiconductor device 100 and the second semiconductor device 200 may be different types of semiconductor device. For example, one of the first semiconductor device 100 and the second semiconductor device 200 may include a memory chip, and the other may include a logic chip. For example, the memory chip may include a volatile memory device, such as dynamic random access memory (DRAM) and static random access memory (SRAM), and a non-volatile memory device, such as phase-change random access memory (PRAM), magnetic random access memory (MRAM), ferroelectric random access memory (FeRAM), and resistive memory access memory (RRAM). For example, the logic chip may include a central processing unit (CPU) chip, a graphics processing unit (GPU) chip, an application processor (AP) chip, and an application specific integrated circuit (ASIC) chip. However, embodiments are not limited thereto.

In embodiments, the first semiconductor device 100 and the second semiconductor device 200 may include the same type of semiconductor device.

The first semiconductor device 100 may include a first semiconductor substrate 110, a first interconnect structure 120, and a first bonding layer 130.

The first semiconductor substrate 110 may include an active surface and an inactive surface opposite to each other. The active surface of the first semiconductor substrate 110 may correspond to an upper surface of the first semiconductor substrate 110 facing the second semiconductor device 200, and an inactive surface of the first semiconductor substrate 110 may correspond to a lower surface of the first semiconductor substrate 110.

The first semiconductor substrate 110 may include, for example, silicon (Si). According to another embodiment, the first semiconductor substrate 110 may include a single-element semiconductor such as germanium (Ge) and a compound semiconductor such as silicon carbide (SiC), gallium arsenide (GaAs), indium arsenide (InP), and indium phosphide (InP). The first semiconductor substrate 110 may include a conductive region including, for example, a well doped with impurities, or a structure doped with impurities. In addition, the first semiconductor substrate 110 may have various device isolation structures, such as a shallow trench isolation (STI) structure.

The first interconnect structure 120 may be arranged on the first semiconductor substrate 110. The first interconnect structure 120 may include a back end of line (BEOL) structure. The first interconnect structure 120 may include a first insulating layer 125 covering an upper surface of the first semiconductor substrate 110 and a first conductive interconnect pattern 121 provided in the first insulating layer 125. The first conductive interconnect pattern 121 may be electrically connected to individual elements that are arranged on and/or in the first semiconductor substrate 110.

The first conductive interconnect pattern 121 of the first interconnect structure 120 may include a plurality of first interconnect lines and a plurality of first interconnect vias. The plurality of first interconnect lines and the plurality of first interconnect vias may be covered by the first insulating layer 125. Each of the plurality of first interconnect lines may extend in the horizontal direction (e.g., the X direction and/or the Y direction) in the first insulating layer 125. The plurality of first interconnect lines may be at different levels in the vertical direction (e.g., in the Z direction) in the first insulating layer 125, and thus, the plurality of first interconnect lines may be provided as a multilayer interconnect structure. The plurality of first interconnect vias may extend between the first interconnect lines, which are at different vertical levels, in such a configuration that the first interconnect lines are electrically connected with each other by the first interconnect vias.

For example, the first conductive interconnect pattern 121 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), and an alloy of the metals described above.

In some embodiments, the first insulating layer 125 may include an oxide and/or a nitride. For example, the first insulating layer 125 may include silicon oxide and/or silicon nitride. In embodiments, the first insulating layer 125 may include an insulating material such as photo imageable dielectric (PID), photosensitive polyimide (PSPI), etc.

The first bonding layer 130 may be arranged on the first interconnect structure 120. The first bonding layer 130 may include a plurality of first bonding pads 131 and a first pad insulating layer 135 surrounding the plurality of first bonding pads 131. The first pad insulating layer 135 may be arranged on the first interconnect structure 120.

The plurality of first bonding pads 131 may be substantially at the same vertical level and may be spaced apart from each other in the horizontal direction. Upper surfaces of the plurality of first bonding pads 131 may be a portion of an upper surface of the first semiconductor device 100 and as a bonding interface between the first semiconductor device 100 and the second semiconductor device 200. The plurality of first bonding pads 131 may include a metal material such as copper (Cu), aluminum (Al), tungsten (W), silver (Ag), and gold (Au).

The first pad insulating layer 135 may extend along the upper surface of the first interconnect structure 120 to cover an upper surface of the first interconnect structure 120 and may cover side surfaces of the plurality of first bonding pads 131. An upper surface of the first pad insulating layer 135 may be substantially at the same vertical level as the upper surfaces of the plurality of first bonding pads 131. Thus, the upper surface of the first pad insulating layer 135 may also be a portion of the upper surface of the first semiconductor device 100 and as the bonding interface between the first semiconductor device 100 and the second semiconductor device 200. The first pad insulating layer 135 may include an oxide and/or a nitride. For example, the first pad insulating layer 135 may include at least any one material selected from among silicon mono-oxide (SiO), silicon nitride (SiN), carbon-doped silicon nitride (SiCN), carbon-doped silicon mono-oxide (SiCO), and a polymer. For example, the polymer may include benzocyclobutene (BCB), polyimide (PI), poly benzoxazole (PBO), silicone, and epoxy.

The second semiconductor device 200 may include a second semiconductor substrate 210, a second interconnect structure 220, a plurality of through electrodes 251, a plurality of conductive pads 255, and a second bonding layer 230.

The second semiconductor substrate 210 may have an upper surface and a lower surface opposite to each other. Thus, the upper surface of the second semiconductor substrate 210 may be an inactive surface and the lower surface of the second semiconductor substrate 210 may be an active surface. The second semiconductor substrate 210 may have the same material as the first semiconductor substrate 110. The second semiconductor substrate 210 may include a conductive region including, for example, a well doped with impurities, a structure doped with impurities, and various device isolation structures such as an STI structure.

The second interconnect structure 220 may be positioned under the second semiconductor substrate 210. The second interconnect structure 220 may include a BEOL structure. The second interconnect structure 220 may include a second insulating layer 225 covering the lower surface of the second semiconductor substrate 210 and a second conductive interconnect pattern 221 in the second insulating layer 225. The second conductive interconnect pattern 221 may be electrically connected to individual elements that are arranged on and/or in the second semiconductor substrate 210. The material of the second conductive interconnect pattern 221 may be the same as that of the first conductive interconnect pattern 121 described above. A material of the second insulating layer 225 may be the same as that of the first insulating layer 125.

The second conductive interconnect pattern 221 may include a plurality of second interconnect lines and a plurality of second interconnect vias. The plurality of second interconnect lines and the plurality of second interconnect vias may be covered by the second insulating layer 225. Each of the plurality of second interconnect lines may extend in the horizontal direction (e.g., the X direction and/or the Y direction) in the second insulating layer 225. The plurality of second interconnect lines may be at different levels in the vertical direction (e.g., in the Z direction) in the second insulating layer 225, and thus, the plurality of second interconnect lines may be provided as a multilayer interconnect structure. The plurality of second interconnect vias may extend between the second interconnect lines, which are at different vertical levels, in such a configuration that the second interconnect lines are electrically connected with each other by the second interconnect vias.

The plurality of through electrodes 251 may vertically penetrate the second semiconductor substrate 210. Each of the through electrodes 251 may include a column-shaped conductive plug and a cylinder-shaped conductive barrier layer surrounding a side surface of the conductive plug. For example, the conductive plug may include copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), and a combination thereof. The conductive barrier layer may include titanium (Ti), titanium nitride (TiN), tantalum (Ta), tantalum nitride (TaN), tungsten (W), tungsten nitride (WN), ruthenium (Ru), cobalt (Co), and a combination thereof. A via insulating layer may be provided between the individual through electrodes 251 and the second semiconductor substrate 210. The via insulating layer may include an oxide. Each through electrode 251 may be electrically connected to the second conductive interconnect pattern 221 of the second interconnect structure 220 and a plurality of second bonding pads 231 of the second bonding layer 230, which are described below. In some embodiments, each of the plurality of through electrodes 251 may be configured to further penetrate at least a portion of the second interconnect structure 220.

The plurality of conductive pads 255 may be provided on the upper surface of the second semiconductor substrate 210 and electrically connected to the plurality of through electrodes 251. Each conductive pad 255 may be electrically connected to a corresponding through electrode 251 among the plurality of through electrodes 251. The plurality of conductive pads 255 may include a metal material such as copper (Cu), aluminum (Al), tungsten (W), silver (Ag), and gold (Au).

The second bonding layer 230 may be provided under the second interconnect structure 220 and in contact with the first bonding layer 130 of the first semiconductor device 100. The second bonding layer 230 may be bonded to the first bonding layer 130, and the second bonding layer 230 and the first bonding layer 130 may be in continuous contact from one side to the other side of the second semiconductor device 200 in the horizontal direction. The second bonding layer 230 may include a plurality of second bonding pads 231 and a second pad insulating layer 235 surrounding the plurality of second bonding pads 231.

The plurality of second bonding pads 231 may be substantially at the same vertical level and may be spaced apart from each other in the horizontal direction. The plurality of second bonding pads 231 may be bonded to the plurality of first bonding pads 131. Each of the second bonding pads 231 may be in direct contact with a corresponding first bonding pad 131 among the plurality of first bonding pads 131. Lower surfaces of the plurality of second bonding pads 231 may be a portion of the lower surface of the second semiconductor device 200 and as the bonding interface between the first semiconductor device 100 and the second semiconductor device 200. The plurality of second bonding pads 231 may have substantially the same material as the plurality of first bonding pads 131.

The second pad insulating layer 235 may extend along the lower surface of the second interconnect structure 220 to cover the lower surface of the second interconnect structure 220 and may cover side surfaces of the plurality of second bonding pads 231. The second pad insulating layer 235 may be bonded to the first pad insulating layer 135. A lower surface of the second pad insulating layer 235 may be substantially at the same vertical level as the lower surfaces of the plurality of second bonding pads 231. Thus, the lower surface of the second pad insulating layer 235 may also be a portion of the lower surface of the second semiconductor device 200 and as the bonding interface between the first semiconductor device 100 and the second semiconductor device 200. The lower surface of the second pad insulating layer 235 may be in direct contact with the upper surface of the first pad insulating layer 135. The second pad insulating layer 235 may have the same material as the first pad insulating layer 135. In some embodiments, the first pad insulating layer 135 and the second pad insulating layer 235 may include silicon oxide.

The cover insulating layer 510 may be provided on the first semiconductor device 100 and may cover a least a portion of the second semiconductor device 200. The cover insulating layer 510 may extend along an upper surface of an peripheral portion of the first semiconductor device 100 that is not covered by the second semiconductor device 200. The cover insulating layer 510 may extend along a side surface and an upper surface of the second semiconductor device 200. A side surface of the cover insulating layer 510 may be vertically aligned with a side surface of the first semiconductor device 100.

Thus, the cover insulating layer 510 may include a side cover 513 extending along the side surface of the second semiconductor device 200 on the peripheral portion of the first semiconductor device 100, and a passivation layer 512 extending along the upper surface of the second semiconductor substrate 210 of the second semiconductor device 200. The passivation layer 512 may extend along the upper surface of the second semiconductor substrate 210 and may be in contact with side surfaces of the plurality of conductive pads 255. The passivation layer 512 may not cover upper surfaces of the plurality of conductive pads 255 in such a configuration that the upper surfaces of the plurality of conductive pads 255 are exposed to the outside of the semiconductor package 10. In some embodiments, an upper surface of the passivation layer 512 may be at a higher vertical level than the upper surface of the second semiconductor substrate 210. In some embodiments, the upper surface of the passivation layer 512 may be substantially coplanar with the upper surfaces of the plurality of conductive pads 255. In some embodiments, the thickness of the passivation layer 512 may be in a range of about 1 µm to about 5 µm or of about 1 µm to about 3 µm.

The cover insulating layer 510 may include an oxide and/or a nitride. In some embodiments, the cover insulating layer 510 may include silicon oxide. In some embodiments, the cover insulating layer 510 may include a tetraethyl ortho-silicate (TEOS)-based oxide formed by a chemical vapor deposition (CVD) process.

The first semiconductor device 100 may include a trench 140 extending downward from the upper surface of the first semiconductor device 100. The trench 140 may be at the peripheral portion of the first semiconductor device 100. The trench 140 may penetrate the first bonding layer 130 and the first interconnect structure 120 of the first semiconductor device 100. Furthermore, the trench 140 may extend to an upper portion of the first semiconductor substrate 110 of the first semiconductor device 100, so that at least a recess corresponding to the trench 140 may be provided in the upper portion of the first semiconductor substrate 110. The trench 140 may be formed by removing a portion of the first bonding layer 130, a portion of the first interconnect structure 120, and a portion of the first semiconductor substrate 110. The trench 140 may be formed by a side surface of the first bonding layer 130, a side surface of the first interconnect structure 120, and an inner surface of the recess of the first semiconductor substrate 110. In a plan view, the trench 140 may extend continuously along an outer peripheral portion of the first semiconductor device 100. The surface of the first semiconductor device 100 forming the trench 140, that is, the side surface of the first bonding layer 130, the side surface of the first interconnect structure 120, and the inner surface of the recess of the first semiconductor substrate 110, may be a straight line and/or a curve in a cross-sectional view.

The cover insulating layer 510 may include a gap-fill portion 511 at least partially filling the trench 140 of the first semiconductor device 100. The gap-fill portion 511 of the cover insulating layer 510 may fill the trench 140 of the first semiconductor device 100, and may entirely fill the trench 140 of the first semiconductor device 100. The gap-fill portion 511 of the cover insulating layer 510 may extend along some surfaces of the first semiconductor device 100 by which the trench 140 is formed, that is, the side surface of the first bonding layer 130, the side surface of the first interconnect structure 120, and the inner surface of the recess of the first semiconductor substrate 110. The cover insulating layer 510 may be provided as a single layer or a single piece, and thus, the gap-fill portion 511 of the cover insulating layer 510 may have the same material as the passivation layer 512 and the side cover 513 of the cover insulating layer 510.

The gap-fill portion 511 of the cover insulating layer 510 filled in the trench 140 of the first semiconductor device 100 may function as a dam structure for blocking crack propagation toward circuits of the first semiconductor device 100 and/or the second semiconductor device 200. Particularly, as the gap-fill portion 511 of the cover insulating layer 510 in the trench 140 of the first semiconductor device 100 passes through the first interconnect structure 120 and extends to the inside of the first semiconductor substrate 110, for example, into the recess of the first semiconductor substrate 110, sawing cracks, which are generated in a sawing process for manufacturing the semiconductor package 10, may be effectively prevented from propagating to the circuit of the first interconnect structure 120. Accordingly, damage to the first semiconductor device 100 and the second semiconductor device 200 may be sufficiently prevented, to thereby improve the reliability of the semiconductor package 10.

Furthermore, in some embodiments, at least a groove 515 may be provided in an edge portion of the upper surface of the cover insulating layer 510. The groove 515 of the cover insulating layer 510 may extend continuously along the edge portion of the upper surface of the cover insulating layer 510. A surface of the cover insulating layer 510, which defines the groove 515 of the cover insulating layer 510, may be a straight line and/or a curve in a cross-sectional view.

The groove 515 of the cover insulating layer 510 may function as the dam structure for blocking crack propagation toward circuits of the first semiconductor device 100 and/or the second semiconductor device 200. The groove 515 of the cover insulating layer 510 may block the sawing cracks, which are generated in the sawing process for manufacturing the semiconductor package 10, from propagating toward the first semiconductor device 100 and/or the second semiconductor device 200.

Figure 2A:
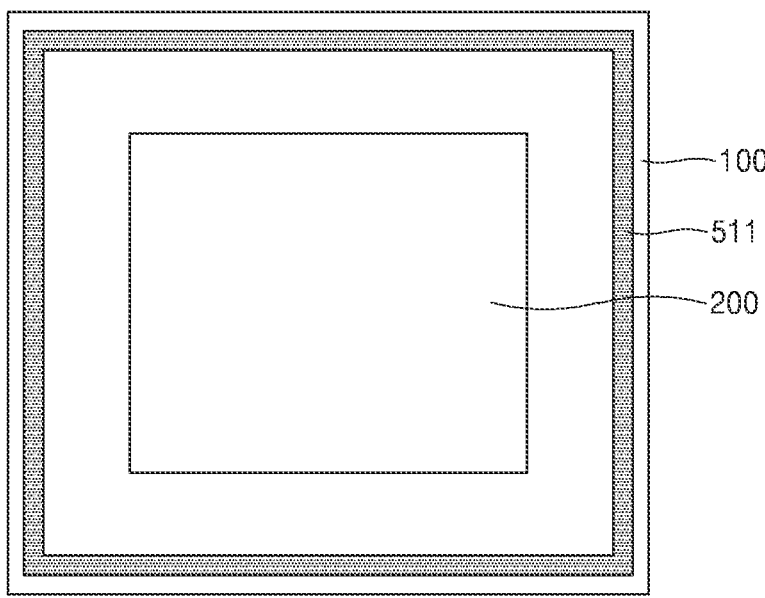
FIGS. 2A and 2B are plan views illustrating a semiconductor package, according to an embodiment.
Figure 2A:
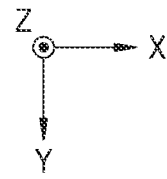
Figure 2B:
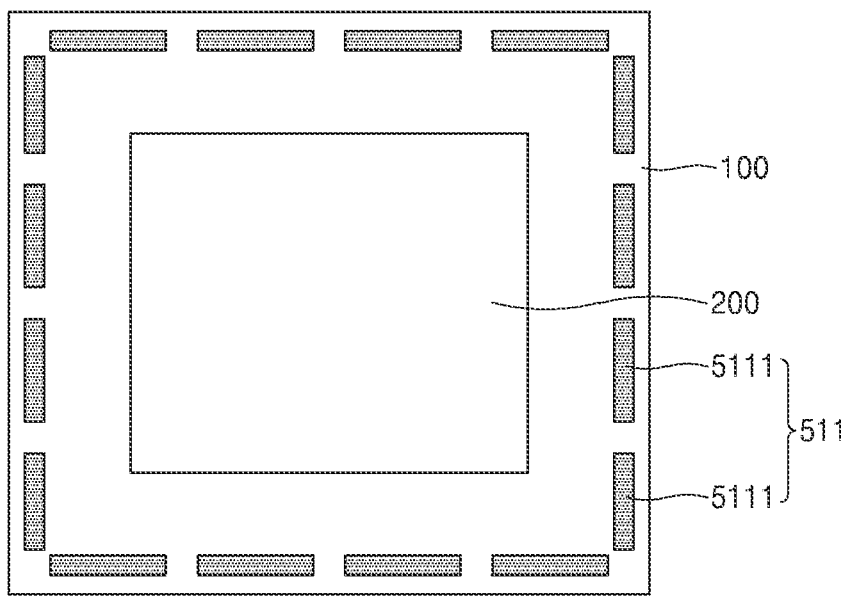
Figure 2B:
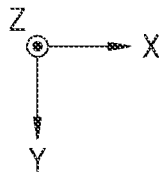

FIGS. 2A and 2B are plan views illustrating a semiconductor package, according to an embodiment. FIGS. 2A and 2B illustrate that some elements of the semiconductor package are omitted.

Referring to FIG. 2A together with FIG. 1, the gap-fill portion 511 of the cover insulating layer 510 may extend continuously along an edge portion of the upper surface of the first semiconductor device 100. In a plan view, the gap-fill portion 511 of the cover insulating layer 510 may be shaped into a closed ring surrounding the second semiconductor device 200. In a plan view, the gap-fill portion 511 of the cover insulating layer 510 may extend linearly along each edge of the upper surface of the first semiconductor device 100 with a substantially uniform width. For example, the trench 140 may be formed in the first semiconductor device 100 in such a configuration that the trench 140 extends continuously along the edge portion of the upper surface of the first semiconductor device 100, and then, an insulating material may be filled into the trench 140, to thereby form the gap-fill portion 511 of the cover insulating layer 510.

Referring to FIG. 2B together with FIG. 1, the gap-fill portion 511 of the cover insulating layer 510 may include a plurality of segments 5111 spaced apart from each other on the upper surface of the first semiconductor device 100. Each of the plurality of segments 5111 of the gap-fill portion 511 of the cover insulating layer 510 may extend linearly along the edge portion of the upper surface of the first semiconductor device 100. For example, a plurality of separated trenches 140 may be formed in the first semiconductor device 100 in such a configuration that the separated trenches 140 are linearly arranged along the edge portion of the upper surface of the first semiconductor device 100, and then, an insulating material may be filled into the plurality of separated trenches 140, to thereby form the plurality of segments 5111 of the gap-fill portion 511 of the cover insulating layer 510.

Figure 3A:
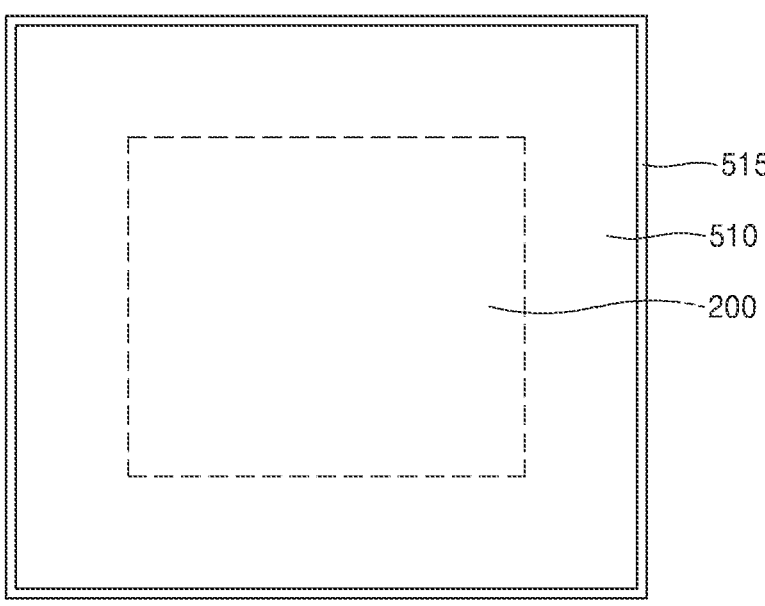
FIGS. 3A and 3B are plan views illustrating a semiconductor package, according to an embodiment.
Figure 3A:
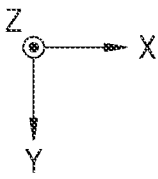
Figure 3B:
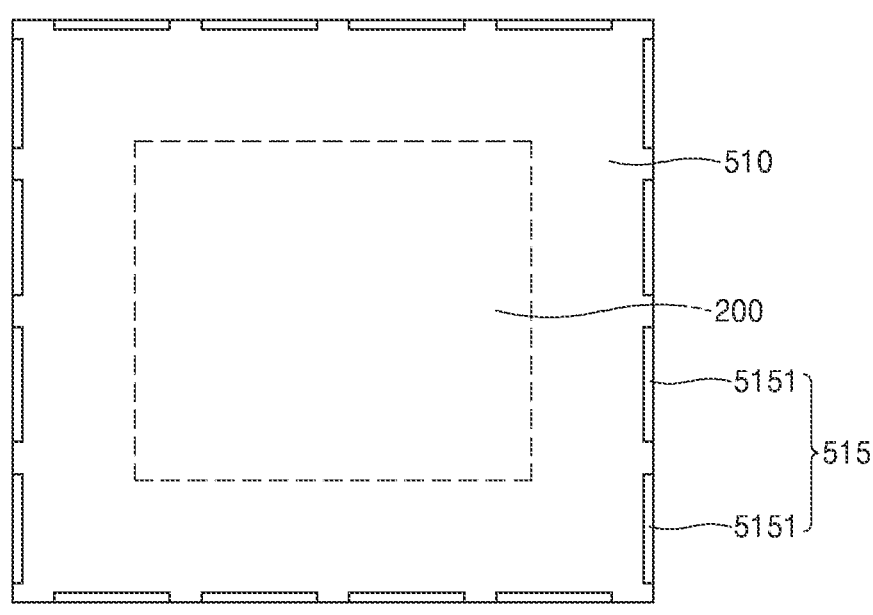
Figure 3B:
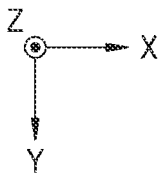

FIGS. 3A and 3B are plan views illustrating a semiconductor package, according to an embodiment.

Referring to FIG. 3A together with FIG. 1, the groove 515 of the cover insulating layer 510 may extend continuously on an edge of the upper surface of the cover insulating layer 510. In a plan view, the groove 515 of the cover insulating layer 510 may be shaped into a closed ring extending continuously along the edge of the upper surface of the cover insulating layer 510. In a plan view, the groove 515 of the cover insulating layer 510 may extend along the edge of the cover insulating layer 510 with a substantially uniform width.

Referring to FIG. 3B together with FIG. 1, the groove 515 of the cover insulating layer 510 may include a plurality of segments 5151 spaced apart from each other along the upper surface of the cover insulating layer 510. Each of the plurality of segments 5151 of the groove 515 of the cover insulating layer 510 may extend linearly along the edge of the upper surface of the cover insulating layer 510.

Figure 4A:
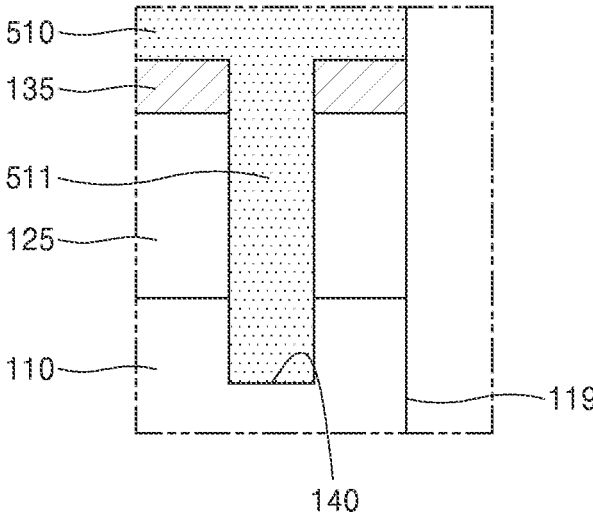
FIGS. 4A, 4B, and 4C are cross-sectional views illustrating a semiconductor package, according to an embodiment.
Figure 4B:
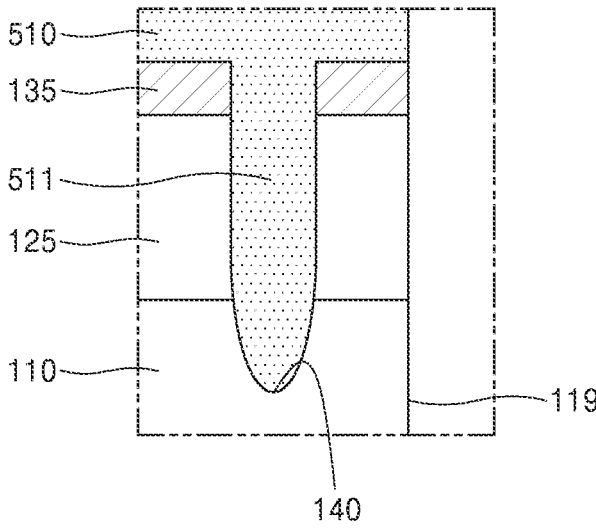
Figure 4C:
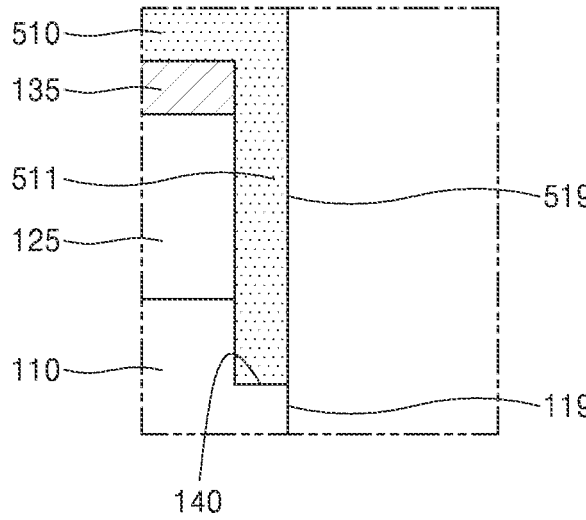

FIGS. 4A to 4C are cross-sectional views illustrating a semiconductor package, according to an embodiment.

Referring to FIG. 4A together with FIG. 1, a width of the trench 140 in the horizontal direction may be uniform in a cross-section view. The trench 140 may include an upper portion formed by the side surface of the first bonding layer 130, a middle portion formed by the side surface of the first interconnect structure 120, and a lower portion formed by the inner surface of the recess of the first semiconductor substrate 110. Thus, in the trench 140, the width of the upper portion, the width of the middle portion, and the width of the lower portion may be substantially the same in the horizontal direction. In addition, the gap-fill portion 511 of the cover insulating layer 510 may include an upper portion extending in the first bonding layer 130, a middle portion extending in the first interconnect structure 120, and a lower portion extending to the recess of the first semiconductor substrate 110. Thus, in the gap-fill portion 511 of the cover insulating layer 510, the width of the upper portion, the width of the middle portion, and the width of the lower portion may be substantially the same in the horizontal direction.

In addition, the gap-fill portion 511 of the cover insulating layer 510 may be positioned inside an outer surface 119 of the first semiconductor substrate 110. The gap-fill portion 511 of the cover insulating layer 510 may be buried in the trench 140 of the first semiconductor device 100 and may not be exposed to the outside of the semiconductor package 10.

Referring to FIG. 4B together with FIG. 1, in a cross-sectional view, the trench 140 may be tapered in such a configuration that a horizontal width of the trench 140 narrows towards a lower end of the trench 140. Thus, the gap-fill portion 511 of the cover insulating layer 510 may have a tapered shape in which a horizontal width narrows towards the lower end of the gap-fill portion 511. That is, the gap-fill portion 511 of the cover insulating layer 510 may have a tapered shape in which the horizontal width narrows towards the lower end thereof.

Referring to FIG. 4C together with FIG. 1, the gap-fill portion 511 of the cover insulating layer 510 may be exposed to the outside of the semiconductor package. In some embodiments, the outer surface 519 of the gap-fill portion 511 of the cover insulating layer 510 and the outer surface 119 of the first semiconductor substrate 110 may be aligned with each other in the vertical direction and be provided as a side surface of the semiconductor package 10.

FIGS. 5A to 5G are cross-sectional views illustrating a method of manufacturing a semiconductor package, according to embodiments. Hereinafter, a method of manufacturing the semiconductor package 10 shown in FIG. 1 is described in detail with reference to FIGS. 5A to 5G. In FIGS. 5A to 5G, the same reference numerals denote the same elements in FIG. 1.

Figure 5A:
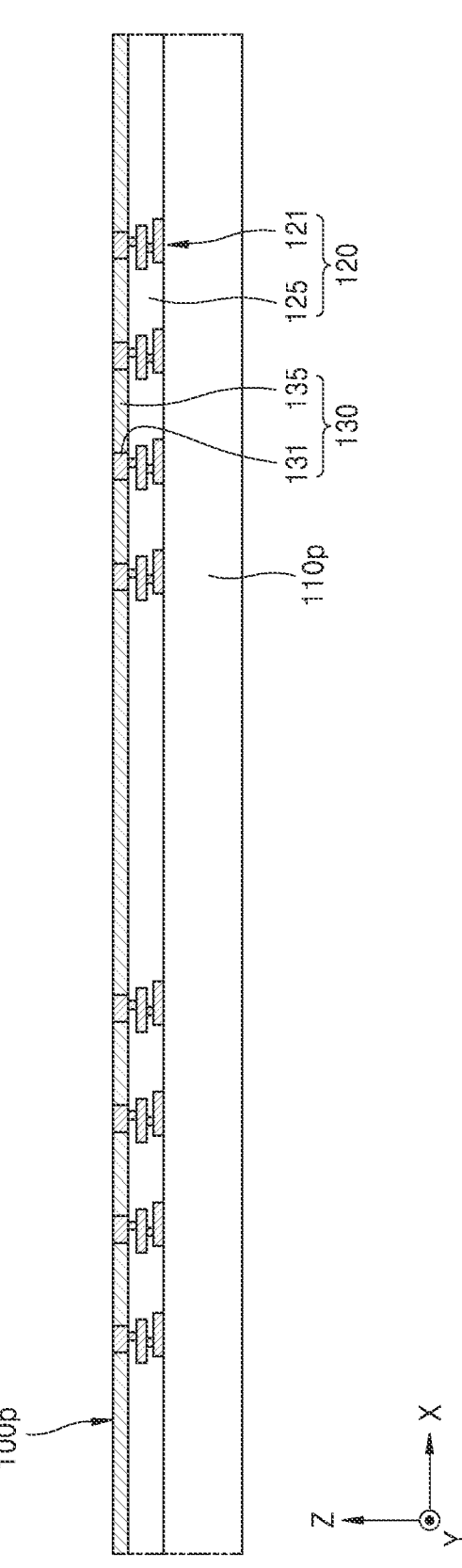
FIGS. 5A, 5B, 5C, 5D, 5E, 5F, and 5G are cross-sectional views illustrating a method of manufacturing a semiconductor package, according to embodiments.

Referring to FIG. 5A, a wafer-level structure 100*p* including a plurality of first semiconductor devices 100 is prepared. The wafer-level structure 100*p* may include a first semiconductor wafer 110*p*, the first interconnect structure 120 on the first semiconductor wafer 110*p*, and the first bonding layer 130 on the first interconnect structure 120.

Figure 5B:
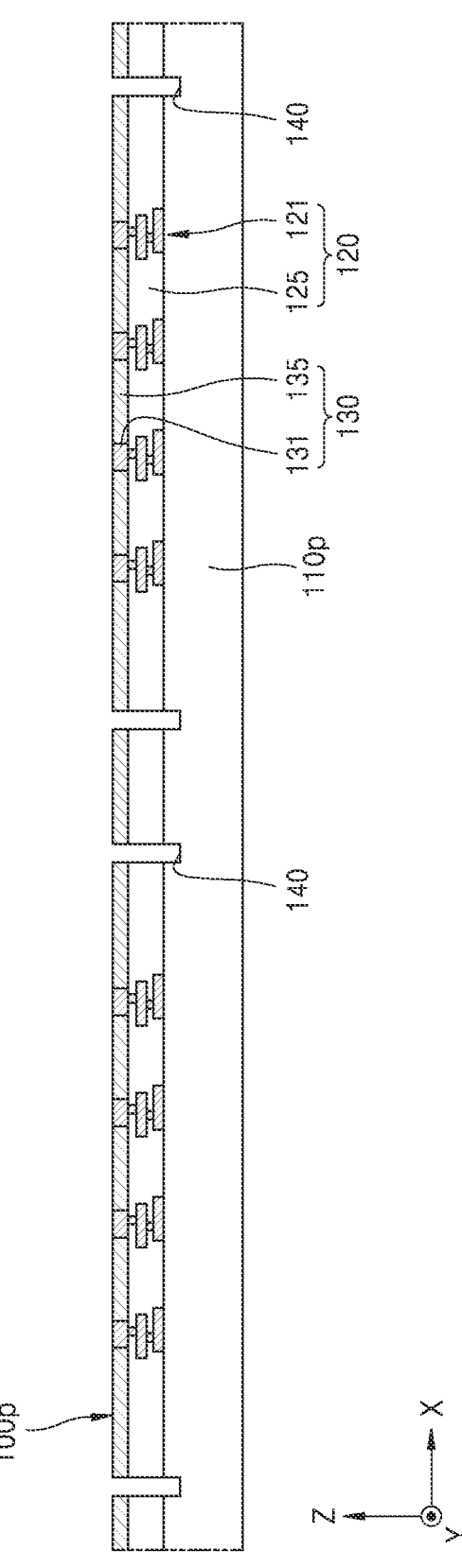

Referring to FIG. 5B, the wafer-level structure 100*p* may be partially removed, to thereby form the plurality of trenches 140. Each of the trenches 140 may be formed in or close to a scribe lane area of the wafer-level structure 100*p*. Each of the trenches 140 may form a region in which a single second semiconductor device 200 is positioned, as described below with reference to FIG. 5C. In a cross-sectional view, each trench 140 may extend downward from an upper surface of the wafer-level structure 100*p* to the inside of the wafer-level structure 100*p*. For example, the wafer-level structure 100*p* may be partially removed by using at least any one of, for example, a dry etching, a wet etching, a laser drilling, a physical cutting by a blade, to thereby form the plurality of trenches 140 in the wafer-level structure 100.

Figure 5C:
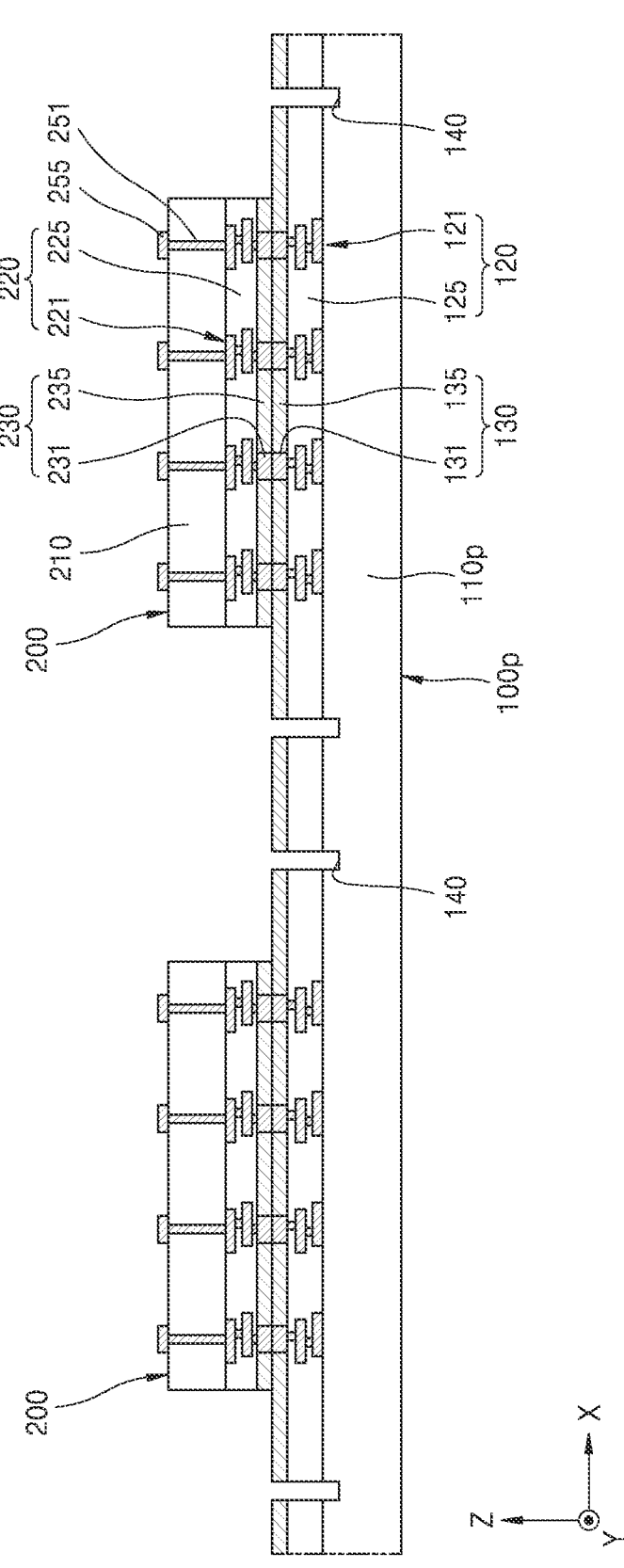

Referring to FIG. 5C, the plurality of second semiconductor devices 200 may be stacked on the wafer-level structure 100*p*. For example, each of the second semiconductor devices 200 may be bonded to the wafer-level structure 100*p* by a bonding process. In some embodiments, each of second semiconductor devices 200 may be bonded to the wafer-level structure 100*p* by a hybrid bonding process. For example, the plurality of second semiconductor devices 200 may contact the wafer-level structure 100*p*, and then, the second bonding layer 230 of each second semiconductor device 200 may be individually bonded to the first bonding layer 130 of the wafer-level structure 100*p* by heat, to thereby stack the plurality of second semiconductor devices 200 onto the wafer-level structure 100*p*.

Figure 5D:
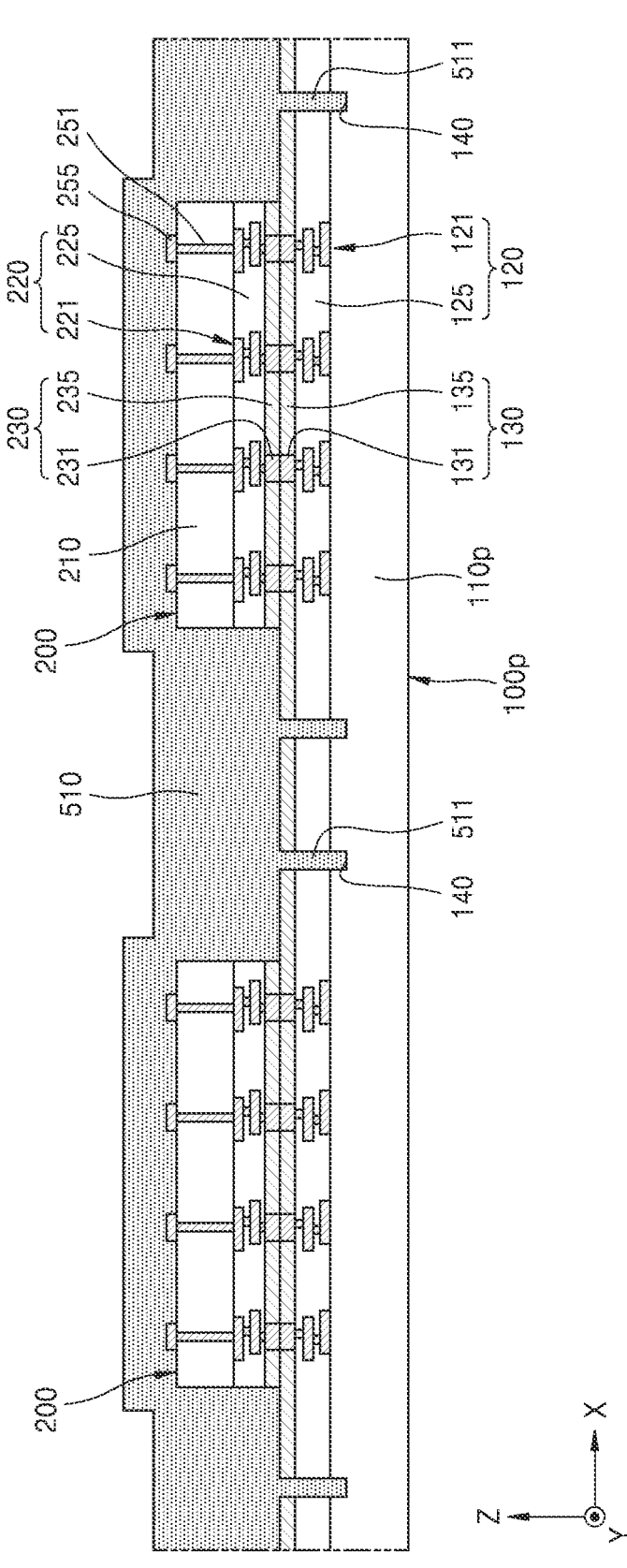

Referring to FIG. 5D, the cover insulating layer 510 may be formed on the wafer-level structure 100*p* in such a way that the plurality of second semiconductor devices 200 are covered with the cover insulating layer 510. The cover insulating layer 510 may be formed by a CVD process. Thus, the upper surface of the wafer-level structure 100*p* and the plurality of second semiconductor devices 200 may be covered with the cover insulating layer 510, and the plurality of trenches 140, which are provided in the wafer-level structure 100p, may be filled with the cover insulating layer 510.

Figure 5E:
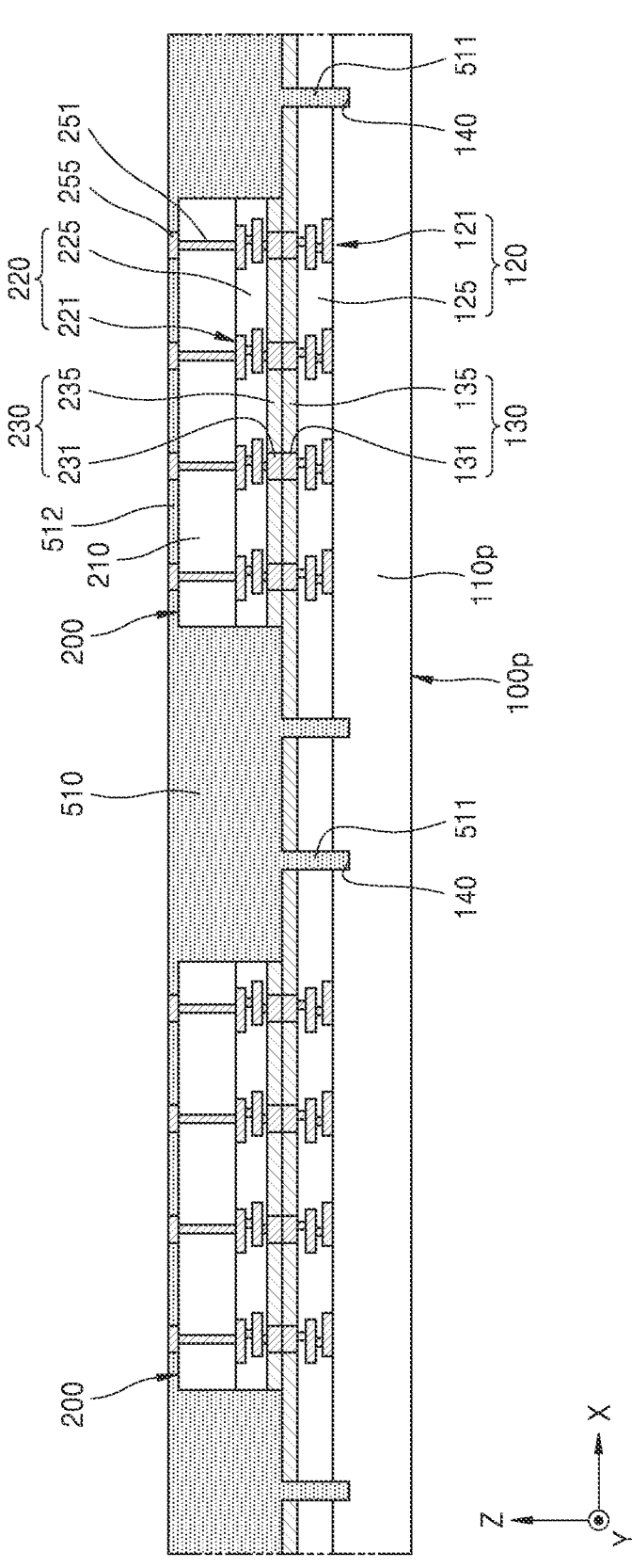

Referring to FIG. 5E, a polishing process may be performed on the cover insulating layer 510, to thereby expose the conductive pads 255 of the plurality of second semiconductor devices 200 to the outside. For example, the cover insulating layer 510 may be partially removed by the polishing process. The polishing process may include a planarization process such as a chemical mechanical polishing (CMP) process. As a result of the polishing process, the upper surface of the cover insulating layer 510 may be planarized. In some embodiments, the upper surface of the cover insulating layer 510 may be coplanar with the upper surfaces of the conductive pads 255 of the second semiconductor devices 200.

Figure 5F:
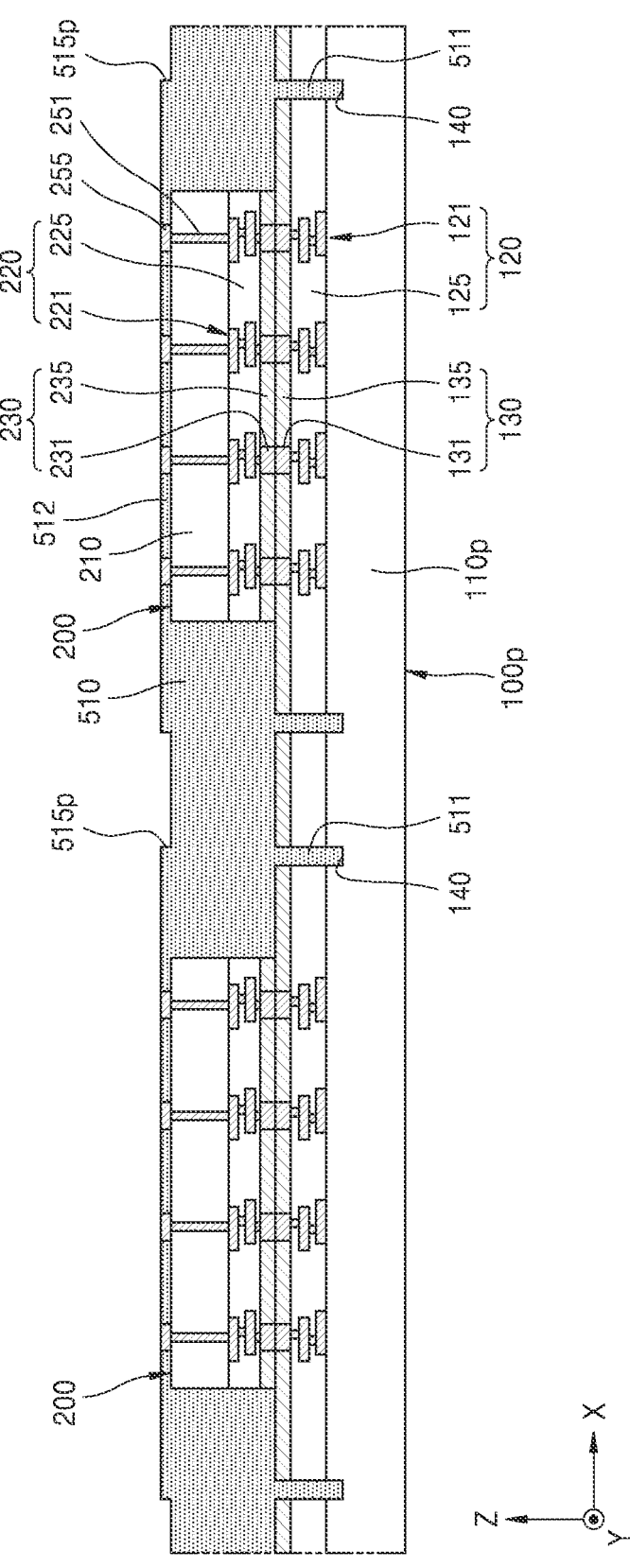

Referring to FIG. 5F, after performing the polishing process on the cover insulating layer 510, an upper portion of the cover insulating layer 510 may be partially removed, to thereby form a preliminary groove 515p. For example, the planarized cover insulating layer 510 may be partially removed by an etching process, to thereby form the preliminary groove 515p in the upper portion of the cover insulating layer 510. The groove 515p may overlap the scribe lane area of the wafer-level structure 100p in the vertical direction. As the preliminary groove 515p is formed in the upper portion of the cover insulating layer 510, the upper surface of the cover insulating layer 510 may have at least a stepped portion in a region overlapping the scribe lane area of the wafer-level structure 100p.

Figure 5G:
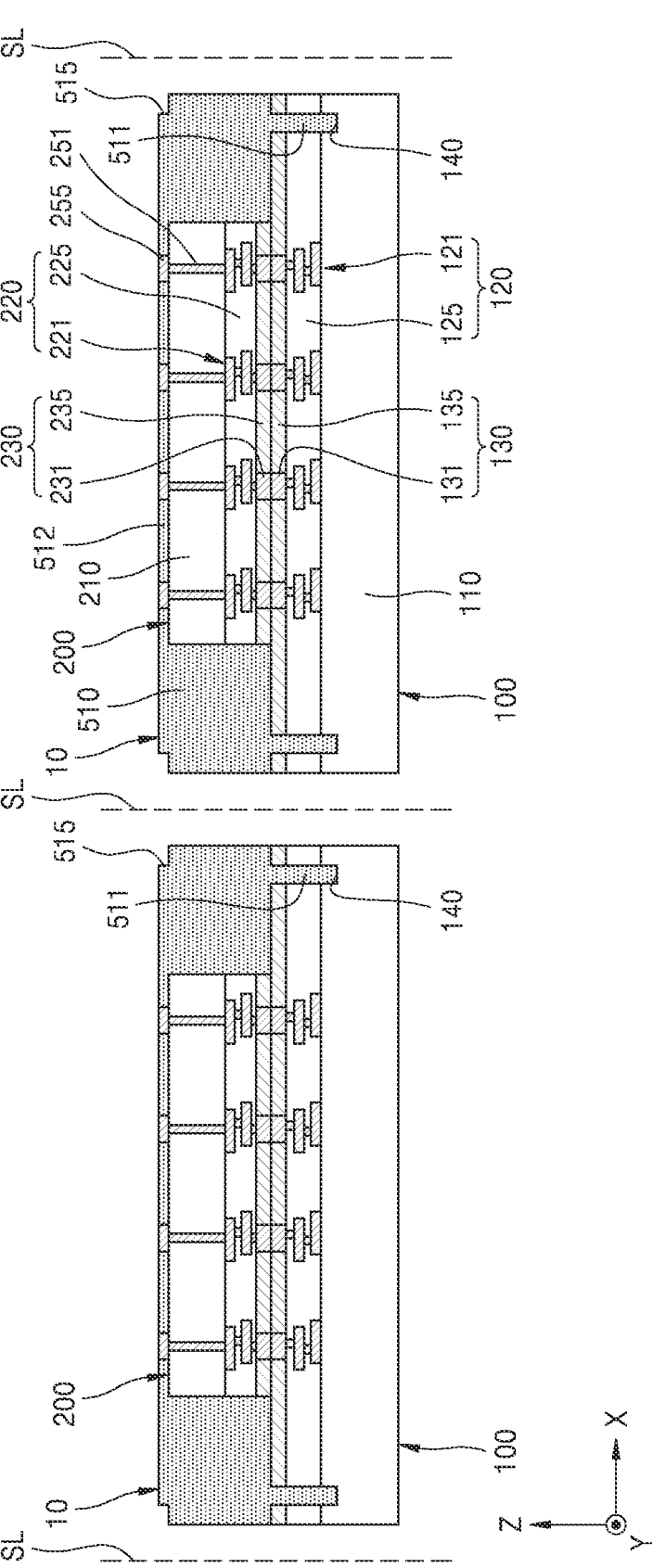

Referring to FIG. 5G, a sawing process may be performed on the structure shown in FIG. 5F, to thereby separate the structure shown in FIG. 5F into pieces of the semiconductor packages 10. For example, the structure shown in FIG. 5F may be cut along the scribe lane SL of the wafer-level structure 100p in the sawing process. The sawing process may include a physical cutting process using a sawing blade. As a result of the sawing process, in each semiconductor package 10, the groove 515 may be formed in the edge portion of the upper surface of the cover insulating layer 510, and the outer surface 519 of the cover insulating layer 510 may be vertically aligned with and coplanar to an outer surface of the first bonding layer 130, an outer surface of the first interconnect structure 120, and the outer surface 119 of the first semiconductor substrate 110.

According to embodiments of the semiconductor package, an insulating material layer, for example, the gap-fill portion 511 of the cover insulating layer 510, in the trench 140 of the first semiconductor device 100 and the groove 515 in the upper surface of the cover insulating layer 510 may function as a dam structure for blocking crack propagation by which the cracks generated in the sawing process are sufficiently prevented from propagating. Accordingly, damage to the first semiconductor device 100 and the second semiconductor device 200 may be sufficiently prevented, to thereby improve the reliability of the semiconductor package 10.

Figure 6:
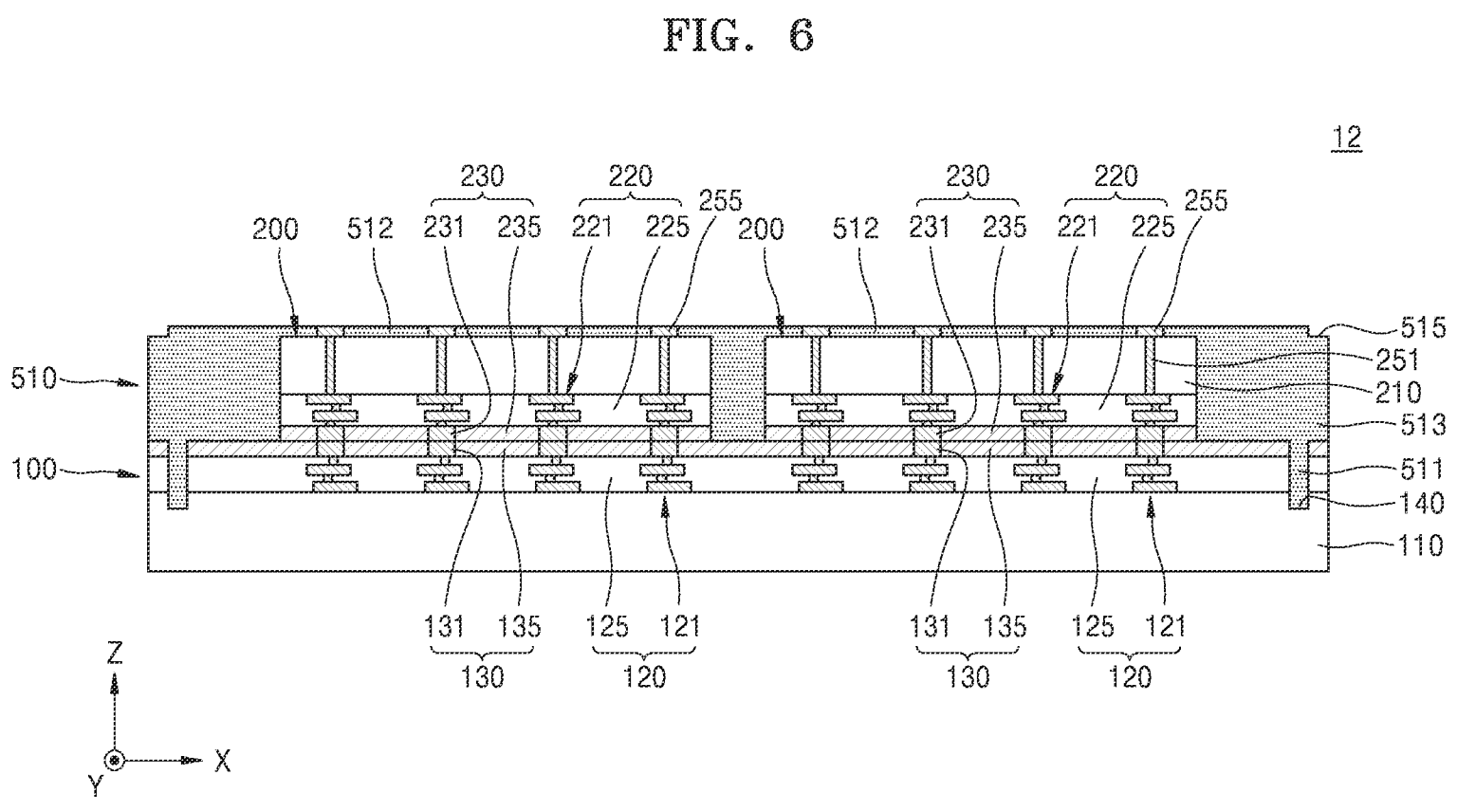

FIG. 6 is a cross-sectional view illustrating a semiconductor package 12, according to another embodiment. Hereinafter, the semiconductor package 12 shown in FIG. 6 is described based on the difference from the semiconductor package 10 that is described with reference to FIG. 1. In FIG. 6, the same reference numerals denote the same elements in FIG. 1.

Referring to FIG. 6, the semiconductor package 12 may include a plurality of second semiconductor devices 200 that are arranged side by side along an upper surface of the first semiconductor device 100. Each of the second semiconductor devices 200 may be bonded to the first semiconductor device 100 by hybrid bonding. In the semiconductor package 12, the cover insulating layer 510 may extend along side surfaces and upper surfaces of each of the second semiconductor devices 200.

Figure 7:
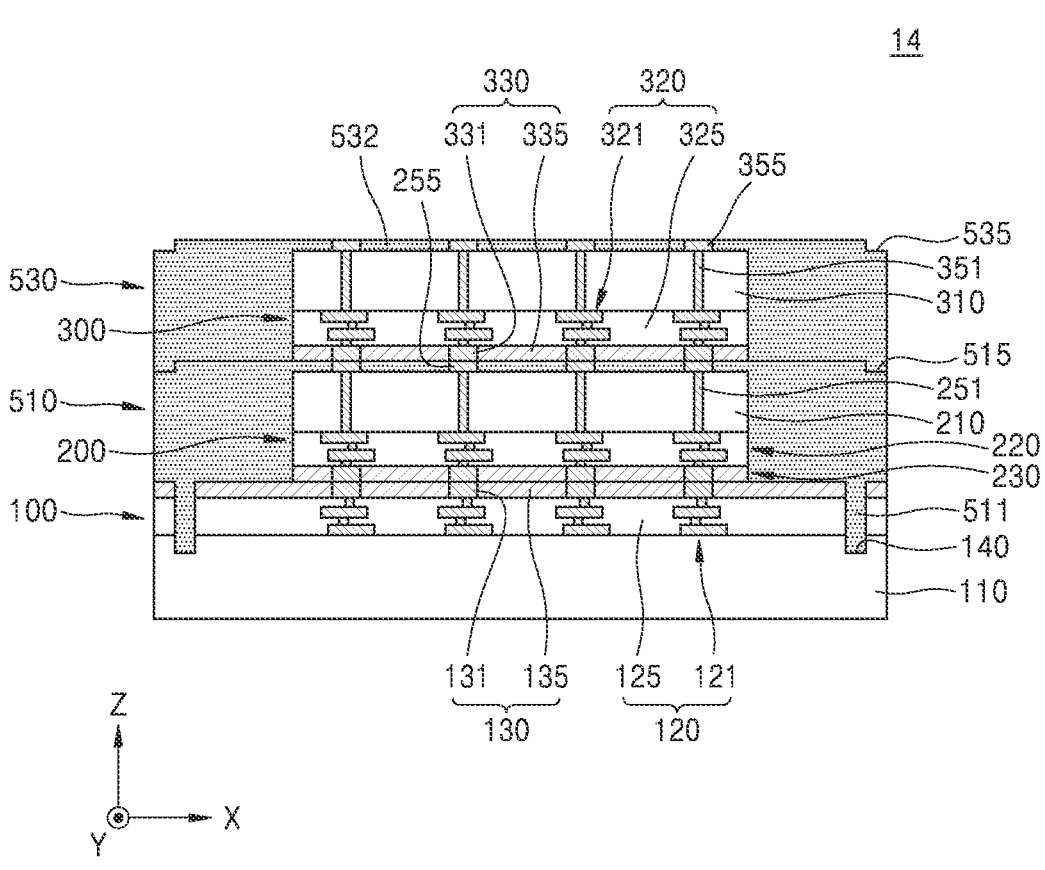
FIG. 7 is a cross-sectional view illustrating a semiconductor package, according to another embodiment.

FIG. 7 is a cross-sectional view illustrating a semiconductor package 14, according to another embodiment. Hereinafter, the semiconductor package 14 shown in FIG. 7 is described based on the difference from the semiconductor package 10 that is described with reference to FIG. 1. In FIG. 7, the same reference numerals denote the same elements in FIG. 1.

Referring to FIG. 7, the semiconductor package 14 may include a third semiconductor device 300 stacked on the second semiconductor device 200. The third semiconductor device 300 may be electrically connected to the through electrode 251 of the second semiconductor device 200. The third semiconductor device 300 may be electrically connected to the first semiconductor device 100 through an electrical connection path including the through electrode 251. The third semiconductor device 300 may be the same semiconductor chip as the second semiconductor device 200 or a different semiconductor chip.

The third semiconductor device 300 may include a third semiconductor substrate 310, a third interconnect structure 320 under the third semiconductor substrate 310, a plurality of through electrodes 351 penetrating the third semiconductor substrate 310, a plurality of conductive pads 355 that are arranged on an upper surface of the third semiconductor substrate 310 and connected to the plurality of through electrodes 351, and a third bonding layer 330 under the third interconnect structure 320. The third interconnect structure 320 may include a third insulating layer 325 and a third conductive interconnect pattern 321 provided in the third insulating layer 325. The third bonding layer 330 may include a plurality of third bonding pads 331 and a third pad insulating layer 335 surrounding the plurality of third bonding pads 331. The plurality of third bonding pads 331 may be connected to the plurality of conductive pads 255 of the second semiconductor device 200, respectively. In some embodiments, each third bonding pad 331 may be in direct contact with a conductive pad 255 of the second semiconductor device 200. In some embodiments, each third bonding pad 331 may be in indirect contact with a conductive pad 255 of the second semiconductor device 200 via a connection bump therebetween. Because the third semiconductor substrate 310 may have a structure similar to the second semiconductor substrate 210, the third interconnect structure 320 may have a structure similar to the second interconnect structure 220, the plurality of through electrodes 351 of the third semiconductor device 300 may have a structure similar to the plurality of through electrodes 251 of the second semiconductor device 200, the plurality of conductive pads 355 of the third semiconductor device 300 may have a structure similar to the plurality of conductive pads 255 of the second semiconductor device 200, and the third bonding layer 330 may have a structure similar to the second bonding layer 230, further detailed descriptions on the similar elements of the third semiconductor device 300 are omitted.

The semiconductor package 14 may further include an upper cover insulating layer 530 that is arranged on the cover insulating layer 510. The upper cover insulating layer 530 may extend along the upper surface of the cover insulating layer 510 and a side surface and an upper surface of the third semiconductor device 300. The upper cover insulating layer 530 may include a passivation layer 532 covering the upper surface of the third semiconductor device 300. The upper cover insulating layer 530 may cover side surfaces of the plurality of conductive pads 355 but may not cover and expose upper surfaces of the plurality of conductive pads 355. In some embodiments, an upper surface of the upper cover insulating layer 530 may be coplanar with the upper surfaces of the plurality of conductive pads 355. The upper surface of the upper cover insulating layer 530 may include a groove 535 in an edge portion thereof. The side surface of the upper cover insulating layer 530 may be vertically aligned with and coplanar to the side surface of the cover insulating layer 510. The upper cover insulating layer 530 may be formed by substantially the same or similar process as the cover insulating layer 510.

Figure 8:
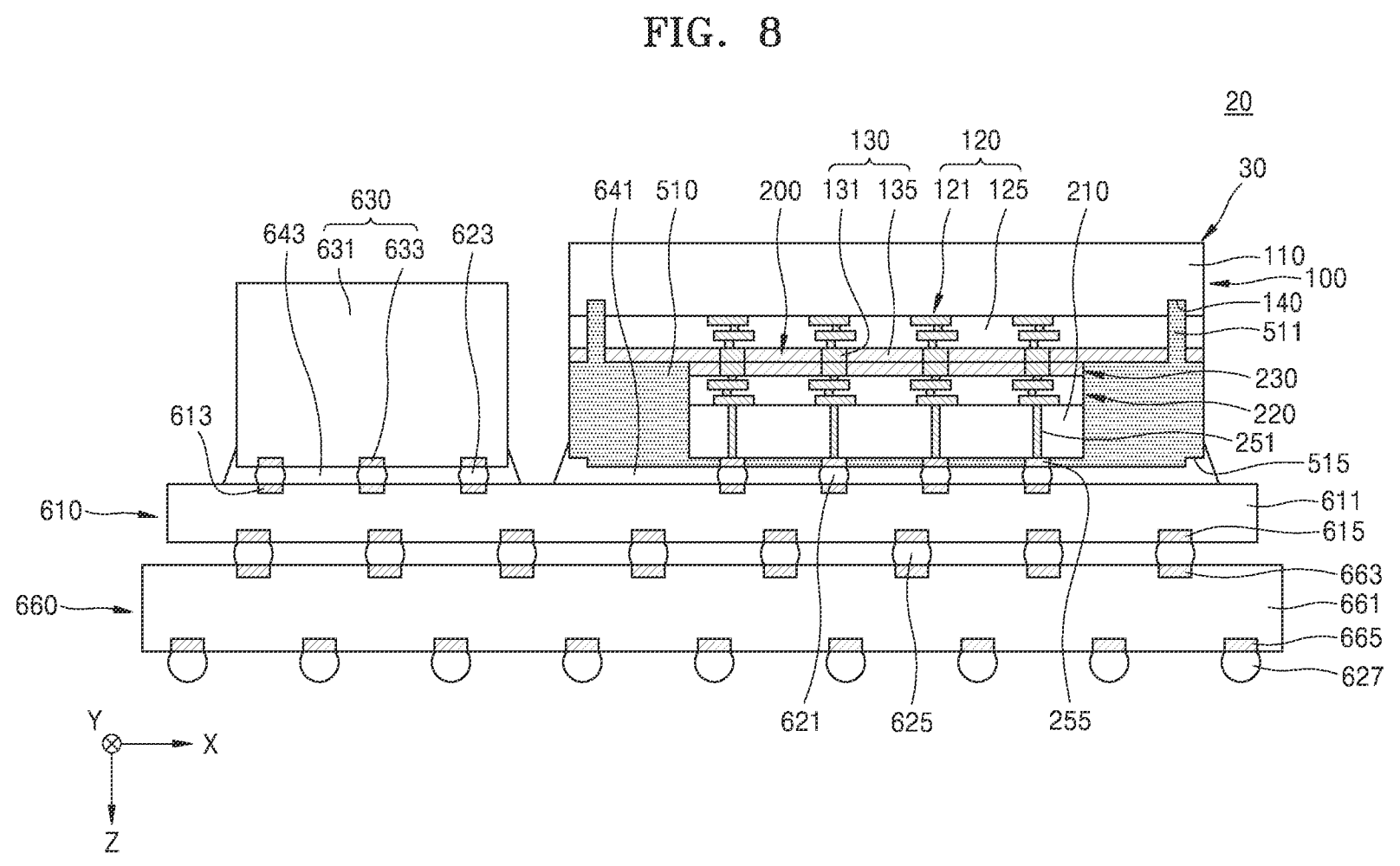

FIG. 8 is a cross-sectional view illustrating a semiconductor package 20, according to another embodiment. In FIG. 8, the same reference numerals denote the same elements in FIG. 1.

Referring to FIG. 8, the semiconductor package 20 may include a main board 660 on which an interposer substrate 610 is mounted, at least a sub-semiconductor package 30 attached to the interposer substrate 610 and including the first semiconductor device 100 and the second semiconductor device 200, and a semiconductor device 630.

In FIG. 8, the sub-semiconductor package 30 may include the semiconductor package 10 shown in FIG. 1. The sub-semiconductor package 30 may also include any one of the semiconductor packages 12 and 14 shown in FIGS. 6 and 7. The sub-semiconductor package 30 is described with reference to FIG. 8 together with FIG. 1. For example, the sub-semiconductor package 30 may be configured in such a structure that the second semiconductor device 200 may be arranged on the interposer substrate 610 and the first semiconductor device 100 may be arranged on the second semiconductor device 200. The second semiconductor device 200 may be referred to as lower semiconductor device and the first semiconductor device 100 may be referred to as upper semiconductor device. The cover insulating layer 510 may be provided between the first semiconductor device 100 and the interposer substrate 610 in such a configuration that the side surface of the second semiconductor device 200 is covered with the cover insulating layer 510 in the sub-semiconductor package 30.

The sub-semiconductor package 30 may be attached to the interposer substrate 610 by a plurality of first connection bumps 621. Each of the first connection bumps 621 may be attached to the conductive pads 255 and may be electrically connected to the first semiconductor device 100 and/or the second semiconductor device 200. The plurality of first connection bumps 621 may transfer at least one of a data signal, a power signal, and a ground signal for the sub-semiconductor package 30.

The semiconductor device 630 may include a third semiconductor substrate 631 having an active surface, a semiconductor device on the active surface, and a plurality of connection pads 633. In some embodiments, each of the plurality of connection pads 633 may include at least one of aluminum, copper, and nickel. The semiconductor device 630 may be attached to the interposer substrate 610 by a plurality of second connection bumps 623. Each of the second connection bumps 623 may be individually attached to each of the connection pads 633. The semiconductor device 630 may include a logic chip and a memory chip. The semiconductor device 630 may be electrically connected to the first semiconductor device 100 and the second semiconductor device 200 of the sub-semiconductor package 30 via the interposer substrate 610.

The interposer substrate 610 may include a base layer 611, a plurality of first upper pads 613 arranged on an upper surface of the base layer 611, a plurality of first lower pads 615 arranged on a lower surface of the base layer 611, a wiring layer electrically connecting the first upper pads 613 and the first lower pads 615 in the base layer 611. The base layer 611 may include a semiconductor, glass, ceramic, and plastic. For example, the base layer 611 may include silicon. The plurality first connection bumps 621 for electrically connecting the sub-semiconductor package 30 to the interposer substrate 610 or the plurality of second connection bumps 623 for electrically connecting the semiconductor device 630 to the interposer substrate 610 may be connected to the plurality of first upper pads 613. In this specification, the interposer substrate 610 may be referred to as connection substrate.

A first underfill layer 641 may be between the sub-semiconductor package 30 and the interposer substrate 610 and a second underfill layer 643 may be between the semiconductor device 630 and the interposer substrate 610. The first underfill layer 641 may surround the first connection bumps 621, and the second underfill layer 643 may surround the second connection bumps 623. The first underfill layer 641 may be in contact with the surface of the cover insulating layer 510 facing the interposer substrate 610, and particularly, with the edge portion of the surface of the cover insulating layer 510 which defines the groove 515 of the cover insulating layer 510.

The semiconductor package 20 may further include a molding layer that is positioned on the interposer substrate 610 and surrounds side surfaces of the sub-semiconductor package 30 and the semiconductor device 630. The molding layer may include, for example, an epoxy mold compound (EMC).

A plurality of board connection terminals 625 may be attached on the plurality of first lower pads 615 of the interposer substrate 610, respectively. The plurality of board connection terminals 625 may electrically connect the interposer substrate 610 to the main board 660.

The main board 660 may include a base board layer 661, a plurality of second upper pads 663 positioned on an upper surface of the base board layer 661, a plurality of second lower pads 665 positioned on a lower surface of the base board layer 661, and a wiring layer electrically connecting the plurality of second upper pads 663 to the plurality of second lower pads 665 in the base board layer 661.

In some embodiments, the main board 660 may include a printed circuit board (PCB). For example, the main board 660 may include a multilayered PCB. The base board layer 661 may include at least one material selected from phenol resin, epoxy resin, and polyimide.

A solder resist layer may be provided on the upper and lower surfaces of the base board layer 661 in such a configuration that the plurality of second upper pads 663 and the plurality of second lower pads 665 are exposed from the solder resist layer. The plurality of board connection terminals 625 may be connected to the plurality of second upper pads 663, respectively, and a plurality of external connection terminals 627 may be connected to the plurality of second lower pads 665, respectively. The board connection terminal 625 may electrically connect the first lower pad 615 to the second upper pad 663. The plurality of external connection terminals 627 connected to the plurality of second lower pads 665 may electrically and physically connect the semiconductor package 20 to an external device.

In some embodiments, the semiconductor package 20 may not include a main board 660, and the plurality of board connection terminals 625 of the interposer substrate 610 may function as the external connection terminals.

While embodiments have been particularly shown and described with reference to embodiments thereof, it will be understood that various changes in form and details may be made therein without departing from the spirit and scope of the following claims and their equivalents.

What is claimed is:

1. A semiconductor package comprising:
a first semiconductor device comprising a first semiconductor substrate, a first interconnect structure on the first semiconductor substrate, and a trench extending into the first interconnect structure and a portion of the first semiconductor substrate;
a second semiconductor device on the first semiconductor device; and
a cover insulating layer on the first semiconductor device and a side surface of the second semiconductor device, the cover insulating layer comprising a first portion filling the trench included in the first semiconductor device and contacting the first semiconductor substrate.

2. The semiconductor package of claim 1, wherein the cover insulating layer comprises oxide.

3. The semiconductor package of claim 2, wherein the cover insulating layer extends along the side surface of the second semiconductor device and an upper surface of the second semiconductor device.

4. The semiconductor package of claim 1, wherein the first portion of the cover insulating layer has a ring shape surrounding the second semiconductor device in a plan view.

5. The semiconductor package of claim 1, wherein the first portion of the cover insulating layer comprises a plurality of segments that are spaced apart from each other along an edge of the first semiconductor device in a plan view.

6. The semiconductor package of claim 1, wherein the first portion of the cover insulating layer is buried in the first semiconductor device.

7. The semiconductor package of claim 1, wherein an outer surface of the first portion of the cover insulating layer is coplanar to an outer surface of the first semiconductor substrate in a vertical direction.

8. The semiconductor package of claim 1, wherein the first portion of the cover insulating layer has a tapered shape having a width decreasing in a vertical direction toward a lower surface of the first portion of the cover insulating layer.

9. The semiconductor package of claim 1, wherein the first semiconductor device comprises a first bonding layer on the first interconnect structure,
wherein the second semiconductor device comprises a second bonding layer bonded to the first bonding layer,
wherein the first bonding layer comprises a plurality of first bonding pads and a first pad insulating layer surrounding the plurality of first bonding pads, and
wherein the second bonding layer comprises a plurality of second bonding pads being in direct contact with the plurality of first bonding pads, respectively, and a second pad insulating layer surrounding the plurality of second bonding pads.

10. The semiconductor package of claim 9, wherein the first pad insulating layer and the second pad insulating layer are in direct contact with each other.

11. The semiconductor package of claim 9, wherein the second semiconductor device comprises:
a second interconnect structure on the second bonding layer;

a second semiconductor substrate on the second interconnect structure;
a plurality of through electrodes penetrating the second semiconductor substrate; and
a plurality of conductive pads on the second semiconductor substrate and connected to the plurality of through electrodes, respectively, and
wherein the cover insulating layer is on side surfaces of the plurality of conductive pads and exposes upper surfaces of the plurality of conductive pads.

12. The semiconductor package of claim 11, further comprising:
a third semiconductor device on the second semiconductor device and electrically connected to the plurality of through electrodes included in the second semiconductor device.

13. The semiconductor package of claim 1, wherein the cover insulating layer comprises a groove in an edge portion of an upper surface of the cover insulating layer.

14. A semiconductor package comprising:
a first semiconductor device comprising a first semiconductor substrate;
a second semiconductor device comprising:
a second semiconductor substrate;
a plurality of through electrodes penetrating the second semiconductor substrate; and
a plurality of conductive pads on an upper surface of the second semiconductor substrate and connected to the plurality of through electrodes, respectively; and
a cover insulating layer comprising a side cover on the first semiconductor device and extending along a side surface of the second semiconductor device and a passivation layer on the upper surface of the second semiconductor substrate and side surfaces of the plurality of conductive pads,
wherein the cover insulating layer comprising a groove, extending along an edge of an upper surface of the cover insulating layer, in an edge portion of the upper surface of the cover insulating layer.

15. The semiconductor package of claim 14, wherein the first semiconductor device comprises a trench extending into a portion of the first semiconductor substrate, and
wherein the cover insulating layer comprises a gap-fill portion filling the trench of the first semiconductor device.

16. A semiconductor package comprising:
a connecting board;
a first semiconductor device on the connecting board, the first semiconductor device comprising:
a first semiconductor substrate;
a first interconnect structure; and
a trench extending into the first interconnect structure and a portion of the first semiconductor substrate;
a second semiconductor device between the connecting board and the first semiconductor device, the second semiconductor device comprising:
a second semiconductor substrate;
a plurality of through electrodes penetrating through the second semiconductor substrate; and
a plurality of conductive pads on a surface of the second semiconductor substrate and connected to the plurality of through electrodes, respectively:
a cover insulating layer between the connecting board and the first semiconductor device and on side surfaces of the second semiconductor device; and
a plurality of connection bumps between the plurality of conductive pads and the connecting board, wherein the cover insulating layer comprises a gap-fill portion in the trench included in the first semiconductor device and contacting the first semiconductor substrate.

17. The semiconductor package of claim 16, wherein a horizontal width of the first semiconductor device is greater than a horizontal width of the second semiconductor device, wherein a side surface of the cover insulating layer is coplanar to a side surface of the first semiconductor device in a vertical direction, and wherein the cover insulating layer comprises a passivation layer on the surface of the second semiconductor substrate and the plurality of conductive pads.

18. The semiconductor package of claim 16, wherein the first semiconductor device comprises a plurality of first bonding pads and a first pad insulating layer surrounding the plurality of first bonding pads, wherein the second semiconductor device comprises a plurality of second bonding pads and a second pad insulating layer surrounding the plurality of second bonding pads, wherein the plurality of first bonding pads are in direct contact with the plurality of second bonding pads, respectively, and wherein the first pad insulating layer is in direct contact with the second pad insulating layer.

19. The semiconductor package of claim 16, wherein the cover insulating layer comprises a groove in an edge portion of a surface of the cover insulating layer that faces the connecting board.

20. The semiconductor package of claim 16, wherein the cover insulating layer comprises silicon oxide.

\* \* \* \* \*